US012701734B2

(12) United States Patent
Lin et al.

(10) Patent No.: US 12,701,734 B2
(45) Date of Patent: Aug. 4, 2026

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Po-Ting Lin, Taichung City (TW); Wu-Wei Tsai, Taoyuan City (TW); Hai-Ching Chen, Hsinchu City (TW); Yu-Ming Lin, Hsinchu City (TW); Chung-Te Lin, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 523 days.

(21) Appl. No.: 18/317,105

(22) Filed: May 15, 2023

(65) Prior Publication Data

US 2024/0387710 A1      Nov. 21, 2024

(51) Int. Cl.
| | |
|---|---|
| *H10D 30/69* | (2025.01) |
| *H10D 30/01* | (2025.01) |
| *H10D 64/68* | (2025.01) |
| *H10D 84/83* | (2025.01) |
| *H10W 20/41* | (2026.01) |

(52) U.S. Cl.
CPC ....... *H10D 30/0415* (2025.01); *H10D 30/701* (2025.01); *H10D 64/689* (2025.01); *H10D 84/83* (2025.01); *H10W 20/435* (2026.01)

(58) Field of Classification Search
CPC . H10D 64/689; H10D 64/033; H10D 30/0415
See application file for complete search history.

(56) References Cited

U.S. PATENT DOCUMENTS

| | | | | |
|---|---|---|---|---|
| 2017/0103988 A1* | 4/2017 | Nishida | ............ | H01L 21/02181 |
| 2019/0130957 A1* | 5/2019 | Müller | ................ | H10D 62/121 |
| 2021/0359082 A1* | 11/2021 | Kang | .................... | H10B 53/30 |
| 2021/0359100 A1* | 11/2021 | Maeng | ................... | H10B 51/00 |
| 2022/0271046 A1* | 8/2022 | Huang | ................ | H10D 64/033 |
| 2024/0032305 A1* | 1/2024 | Kashir | ................... | H10B 53/20 |

* cited by examiner

*Primary Examiner* — Xiaoming Liu
(74) *Attorney, Agent, or Firm* — JCIPRNET

(57) ABSTRACT

A semiconductor device includes a first transistor. The first transistor includes a source region, a drain region, a semi-conductive material layer, a gate dielectric film stack and a gate electrode. The semiconductive material layer is disposed between the source region and the drain region. The gate dielectric film stack is disposed on the semiconductive material layer and includes a first film layer, a second film layer and an intermediate film layer. The first film layer and the second film layer include hafnium. The intermediate layer is sandwiched in between the first film layer and the second film layer and includes hafnium, wherein a hafnium content of the intermediate film layer is lower than a hafnium content of the first film layer and a hafnium content of the second film layer. The gate electrode is disposed on the gate dielectric film stack.

20 Claims, 9 Drawing Sheets

104B {104B1
       104B2

TX2-I

TX2-J

SEMICONDUCTOR DEVICE AND METHOD OF FABRICATING THE SAME

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
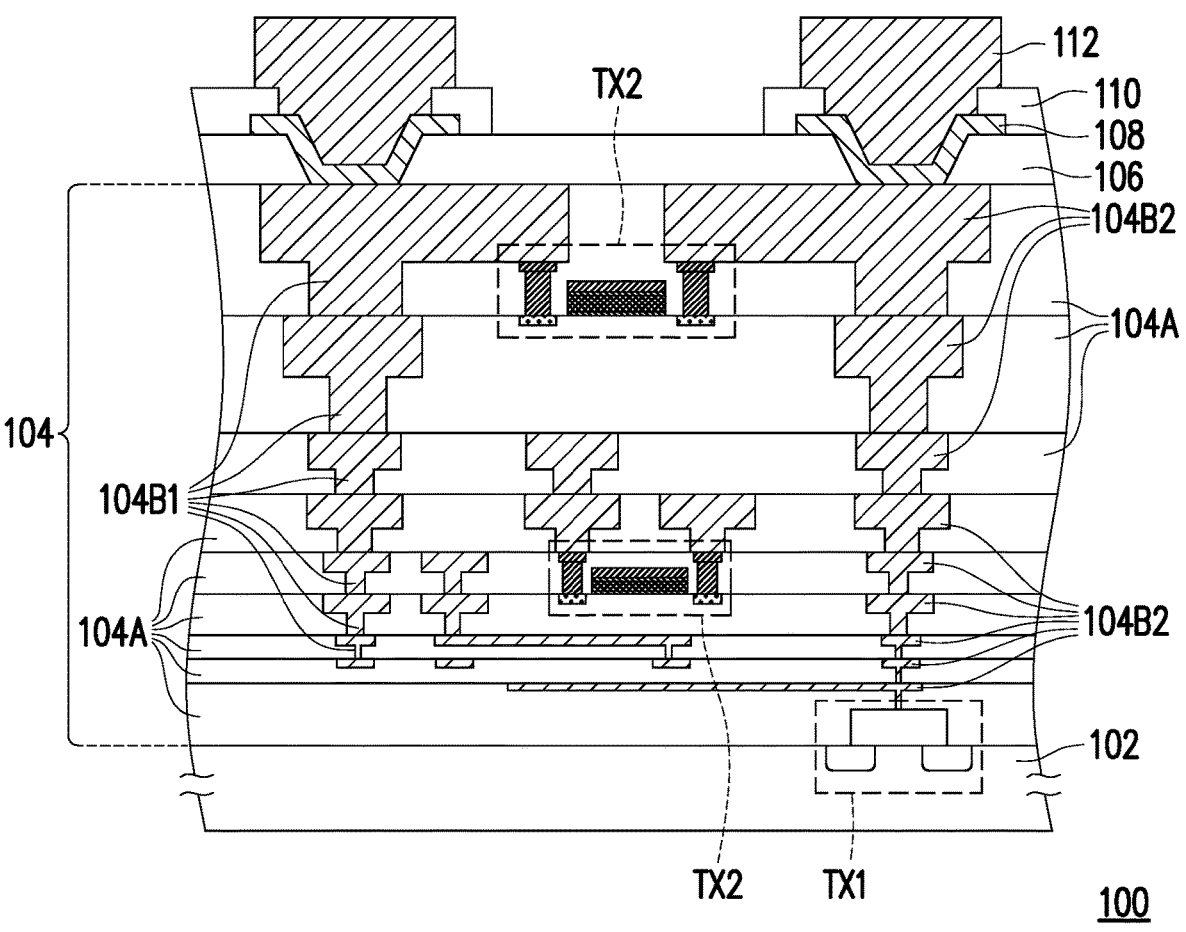
FIG. 1 is a schematic cross-sectional view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventional ferroelectric field-effect transistors (FeFETs) usually include a single film layer of hafnium zirconium oxide ($HfZrO_2$) or hafnium oxide ($HfO_2$) as the gate dielectric film. However, these types of ferroelectric thin films often suffer from endurance issues due to their high switching barrier for oxygen movement. In accordance with some embodiments of the present disclosure, a semiconductor device including FeFETs having a gate dielectric film stack that can induce antiferroelectricity and provide improved endurance is described.

FIG. 1 is a schematic cross-sectional view of a semiconductor device in accordance with some embodiments of the disclosure. In some embodiments, the semiconductor device 100 (or integrated circuit) includes a substrate 102, an interconnection layer 104, a passivation layer 106, a post-passivation layer 110, a plurality of conductive pads 108, and a plurality of conductive terminals 112. In some embodiments, the substrate 102 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 102 may be a bulk silicon substrate, a silicon-on-insulator (SOI) substrate, or a germanium-on-insulator (GOI) substrate.

In some embodiments, the substrate 102 includes various doped regions depending on circuit requirements (e.g., p-type semiconductor substrate or n-type semiconductor substrate). In some embodiments, the doped regions are doped with p-type dopants or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a transistor TX1, which is formed over the substrate 102. Depending on the types of the dopants in the doped regions, the transistor TX1 may be referred to as n-type transistor or p-type transistor. In some embodiments, the transistor TX1 further includes a metal gate and a channel under the metal gate. The channel is located between the source region and the drain region to serve as a path for electron to travel when the transistor TX1 is turned on. On the other hand, the metal gate is located above the substrate 102 and is embedded in the interconnection layer 104. In some embodiments, the transistor TX1 is formed using suitable Front-end-of-line (FEOL) process. For simplicity, one transistor TX1 is shown in FIG. 1. However, it should be understood that more than one transistor TX1 may be presented depending on the application of the semiconductor device 100. When multiple transistors TX1 are presented, these transistors TX1 may be separated by shallow trench isolation (STI; not shown) located between two adjacent transistors TX1.

As illustrated in FIG. 1, the interconnection layer 104 is formed over the substrate 102. In some embodiments, the interconnection layer 104 includes a plurality of dielectric layers 104A and a plurality of conductive layers 104B alternately stacked up along a build-up direction. The interconnection layer 104 further includes a plurality of transistors TX2 located in between the plurality of dielectric layers 104A.

In some embodiments, the conductive layers 104B include conductive vias 104B1 and conductive patterns 104B2 embedded in the dielectric layers 104A. In some embodiments, the conductive patterns 104B2 located at different level heights are connected to one another through the conductive vias 104B1. In other words, the conductive patterns 104B2 are electrically connected to one another through the conductive vias 104B1. In some embodiments, the bottommost conductive vias 104B1 are connected to the transistor TX1. For example, the bottommost conductive vias 104B1 are connected to the metal gate, which is embedded in the bottommost dielectric layer 104A, of the transistor TX1. In other words, the bottommost conductive vias 104B1 establish electrical connection between the transistor TX1 and the conductive patterns 104B2 of the interconnection layer 104. As illustrated in FIG. 1, the bottommost conductive via 104B1 is connected to the metal gate of the transistor TX1. It should be noted that in some alternative cross-sectional views, other bottommost conductive vias 104B1 are also connected to source/drain regions of the transistor TX1. That is, in some embodiments, the bottommost conductive vias 104B1 may be referred to as "contact structures" of the transistor TX1.

In some embodiments, the dielectric layers 104A include materials such as polyimide, epoxy resin, acrylic resin, phenol resin, benzocyclobutene (BCB), polybenzooxazole (PBO), or any other suitable polymer-based dielectric material. Alternatively, the dielectric layers 104A may be formed of oxides or nitrides, such as silicon oxide, silicon nitride, or the like. The dielectric layers 104A may be formed by suitable fabrication techniques such as spin-on coating, chemical vapor deposition (CVD), plasma-enhanced chemical vapor deposition (PECVD), or the like.

In some embodiments, the conductive layers 104B include materials such as aluminum, titanium, copper, nickel, tungsten, or alloys thereof. The conductive layers 104B (including conductive patterns 104B2 and the conductive vias 104B1) may be formed by electroplating, deposition, and/or photolithography and etching. In some embodiments, the conductive patterns 104B2 and the underlying conductive vias 104B1 are formed simultaneously. It should be noted that the number of the dielectric layers 104A, the number of the conductive layers 104B illustrated in FIG. 1 are merely for illustrative purposes, and the disclosure is not limited thereto. In some alternative embodiments, fewer or more layers of the dielectric layers 104A and the conductive layers 104B may be formed depending on the circuit design.

As illustrated in FIG. 1, the transistors TX2 are embedded in the interconnection layer 104. For example, each transistor TX2 may be embedded in one of the dielectric layers 104A, or may be embedded in a plurality of the dielectric layers 104A. In some embodiments, the transistors TX2 are electrically connected to the conductive patterns 104B2 through the corresponding conductive vias 104B1. In some embodiments, the transistors TX2 may be arranged in an array (e.g. array of transistors/array of memory cells) in the dielectric layers 104A. The formation method and the structure of the transistors TX2 will be described in detail later.

As illustrated in FIG. 1, the passivation layer 106, the conductive pads 108, the post-passivation layer 110, and the conductive terminals 112 are sequentially formed on the interconnection layer 104. In some embodiments, the passivation layer 106 is disposed on the topmost dielectric layer 104A and the topmost conductive layer 104B (conductive pattern 104B2). In some embodiments, the passivation layer 106 has a plurality of openings partially exposing the topmost conductive patterns 104B2. In some embodiments, the passivation layer 106 is a silicon oxide layer, a silicon nitride layer, a silicon oxy-nitride layer, or a dielectric layer formed by other suitable dielectric materials. The passivation layer 106 may be formed by suitable fabrication techniques such as high-density plasma chemical vapor deposition (HDP-CVD), PECVD, or the like.

In some embodiments, the conductive pads 108 are formed over the passivation layer 106. In some embodiments, the conductive pads 108 extend into the openings of the passivation layer 106 to be in direct contact with the topmost conductive patterns 104B2. That is, the conductive pads 108 are physically and electrically connected to the interconnection layer 104. In some embodiments, the conductive pads 108 include aluminum pads, titanium pads, copper pads, nickel pads, tungsten pads, or other suitable metal pads. The conductive pads 108 may be formed by, for example, electroplating, deposition, and/or photolithography and etching. It should be noted that the number and the shape of the conductive pads 108 illustrated in FIG. 1 are merely for illustrative purposes, and the disclosure is not limited thereto. In some alternative embodiments, the number and the shape of the conductive pads 108 may be adjusted based on demand.

In some embodiments, the post-passivation layer 110 is formed over the passivation layer 106 and the conductive pads 108. In some embodiments, the post-passivation layer 110 is formed on the conductive pads 108 to protect the conductive pads 108. In some embodiments, the post-passivation layer 110 has a plurality of contact openings partially exposing each conductive pad 108. The post-passivation layer 110 may be a polyimide layer, a PBO layer, or a dielectric layer formed by other suitable polymers. In some embodiments, the post-passivation layer 110 is formed by suitable fabrication techniques such as HDP-CVD, PECVD, or the like.

As further illustrated in FIG. 1, the conductive terminals 112 are formed over the post-passivation layer 110 and the conductive pads 108. In some embodiments, the conductive terminals 112 extend into the contact openings of the post-passivation layer 110 to be in direct contact with the corresponding conductive pad 108. That is, the conductive terminals 112 are electrically connected to the interconnection layer 104 through the conductive pads 108. In some embodiments, the conductive terminals 112 are conductive pillars, conductive posts, conductive balls, conductive bumps, or the like. In some embodiments, a material of the conductive terminals 112 includes a variety of metals, metal alloys, or metals and mixture of other materials. For example, the conductive terminals 112 may be made of aluminum, titanium, copper, nickel, tungsten, tin, and/or alloys thereof. The conductive terminals 112 are formed by, for example, deposition, electroplating, screen printing, or other suitable methods. In some embodiments, the conductive terminals 112 are used to establish electrical connection with other components (not shown) subsequently formed or provided. Up to here, a semiconductor device 100 in accordance with some embodiments of the present disclosure is accomplished.

As illustrated in FIG. 1, a plurality of transistors TX2 are embedded in the interconnection layer 104 in between the dielectric layers 104A. The formation method and the structure of the transistor TX2 will be described in more detail by referring to FIG. 2A to FIG. 2E shown below.

Figure 2A:
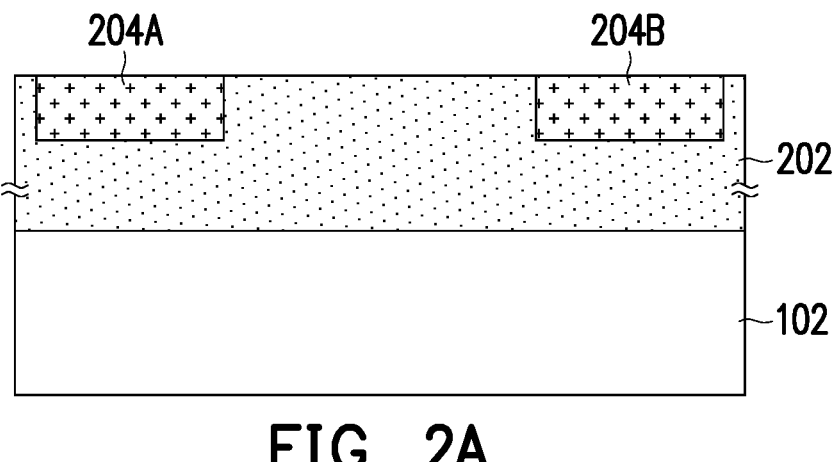
FIG. 2A to FIG. 2E are schematic cross-sectional views illustrating various stages in a method of fabricating a transistor shown in FIG. 1 in accordance with some embodiments of the present disclosure.

FIG. 2A to FIG. 2E are schematic cross-sectional views illustrating various stages in a method of fabricating a transistor shown in FIG. 1 in accordance with some embodiments of the present disclosure. Referring to FIG. 2A, in some embodiments, a semiconductive material layer 202 is formed over the substrate 102. For example, the semiconductive material layer 202 may be formed on the dielectric layers 104A located any level of the interconnection layer 104 shown in FIG. 1. In certain embodiments, the semiconductive material layer 202 may be surrounded by the dielectric layers 104A (not shown). In some embodiments, the semiconductive material layer 202 includes oxide semiconductor material such as ZnO, InO, SnO, $Ga_2O_3$, MgO, GdO, ITO, InZnO (IZO), InGaZnO (IGZO), InWO, InBO (IBO) the like, or a combination thereof. In some embodiments, the semiconductive material layer 202 includes Group IV material such as Si, Ge and their alloy, and may be doped with Group III or V element to enhance mobility. In some embodiments, the semiconductive material layer 202 is made of a single layer having one of the foregoing materials. However, the disclosure is not limited thereto. In some alternative embodiments, the semiconductive material layer 202 may be made of a laminate structure of at least two of the foregoing materials. In some embodiments, the semiconductive material layer 202 is deposited by suitable techniques, such as chemical vapor deposition (CVD), atomic layer deposition (ALD), plasma enhanced atomic layer deposition (PEALD), PVD, PECVD, epitaxial growth, or the like.

As further illustrated in FIG. 2A, in some embodiments, a source region 204A and a drain region 204B are formed on two sides of the semiconductive material layer 202. For example, the semiconductive material layer 202 may be located in between the source region 204A and the drain region 204B. In some embodiments, the source region 204A and the drain region 204B include materials such as cobalt, tungsten, copper, titanium, tantalum, aluminum, zirconium, hafnium, a combination thereof, or other suitable metallic materials. In some embodiments, the material of the source region 204A and the drain region 204B includes conducting oxide material (such as indium-tin-oxide (ITO)) or metal nitride material (such as TaN, TiN, WN, HfN). In some embodiments, the source region 204A and the drain region 204B are formed through CVD, ALD, plating, or other suitable deposition techniques.

Figure 2B:
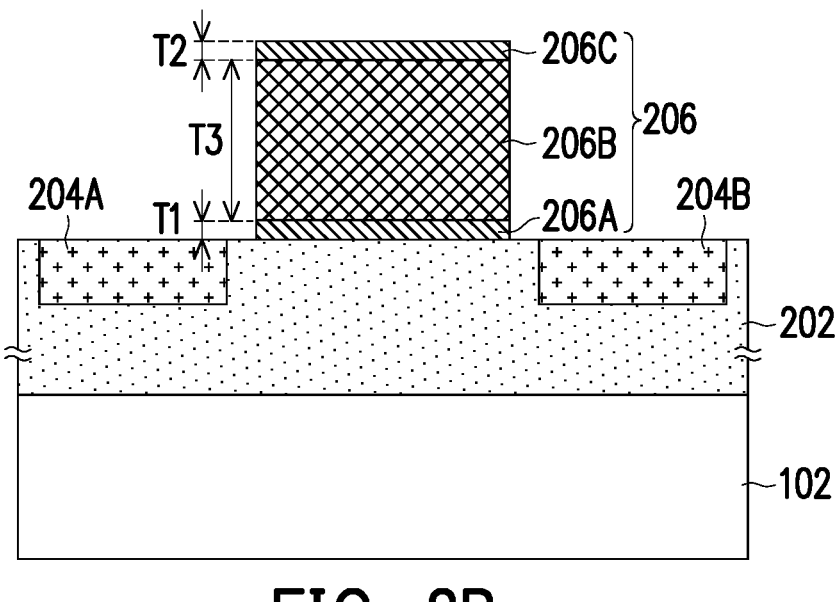

Referring to FIG. 2B, in a subsequent step, a gate dielectric film stack 206 is formed over the semiconductive material layer 202. In some embodiments, the gate dielectric film stack 206 is formed with a plurality of hafnium-based layers (206A, 206B, 206C), and a hafnium content of the plurality of hafnium-based layers (206A, 206B, 206C)

increases from a center of the gate dielectric film stack 206 to top and bottom surfaces of the gate dielectric film stack 206. In some embodiments, forming the gate dielectric film stack 206 includes sequentially forming a first film layer 206A, an intermediate film layer 206B and a second film layer 206C stacked up along a build-up direction. For example, the first film layer 206A, the intermediate film layer 206B and the second film layer 206C are film layers including hafnium (or hafnium-based layers). In certain embodiments, the gate dielectric film stack 206 including the plurality of hafnium-based layers (206A, 206B, 206C) is formed by ALD, or other suitable deposition techniques.

In some embodiments, a hafnium content of the intermediate film layer 206B is lower than a hafnium content of the first film layer 206A and a hafnium content of the second film layer 206C. For example, in some embodiments, the first film layer 206A and the second film layer 206C comprises $Hf_XZr_{(1-x)}O_2$, and wherein X is in a range of 0.5 to 0.7. In other words, the hafnium content of hafnium zirconium oxide ($HfZrO_2$) in the first film layer 206A and the second film layer 206C is approximately 50% to 70% respectively, while the zirconium content of hafnium zirconium oxide ($HfZrO_2$) in the first film layer 206A and the second film layer 206C is 30% to 50% respectively. Furthermore, in some embodiments, the intermediate film layer 206B comprises $Hf_YZr_{(1-Y)}O_2$, and wherein Y is in a range of 0.3 to 0.5. In other words, the hafnium content of hafnium zirconium oxide ($HfZrO_2$) in the intermediate film layer 206B is approximately 30% to 50% respectively, while the zirconium content of hafnium zirconium oxide ($HfZrO_2$) in the intermediate film layer 206B is approximately 50% to 70%. In one exemplary embodiment, the first film layer 206A and the second film layer 206C includes $Hf_{0.7}Zr_{0.3}O_2$, while the intermediate layer 206B includes $Hf_{0.3}Zr_{0.7}O_2$. In some other embodiments, the first film layer 206A and the second film layer 206C includes $Hf_{0.55}Zr_{0.45}O_2$, while the intermediate layer 206B includes $Hf_{0.45}Zr_{0.55}O_2$. In other words, the first film layer 206A and the second film layer 206C are hafnium-rich $HfZrO_2$ layers, while the intermediate layer 206B is a zirconium-rich $HfZrO_2$ layer.

In the exemplary embodiment, the first film layer 206A and the second film layer 206C has a monoclinic phase crystallinity, while the intermediate layer 206B has a tetragonal phase crystallinity. In some embodiments, the intermediate layer 206B is a zirconium-rich $HfZrO_2$ layer having tetragonal phase crystallinity, which will help induce antiferroelectric properties to the gate dielectric film stack 206. On the other hand, if the zirconium content in the $HfZrO_2$ layer is less than 50% (making it hafnium-rich instead of zirconium-rich), then the antiferroelectric properties of the film stack cannot be properly induced. In the exemplary embodiment, due to the antiferroelectric properties of the gate dielectric film stack 206, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor.

To obtain the gate dielectric film stack 206 with the above antiferroelectric properties, a thickness T1 of the first film layer 206A, a thickness T2 of the second film layer 206C, and a thickness T3 of the intermediate layer 206B are controlled in a particular range. For example, the thickness T3 of the intermediate layer 206B is greater than the thickness T1 of the first film layer 206A, and greater than the thickness T2 of the second film layer 206C. In some embodiments, a ratio of the thickness T3 to the thickness T1 (T3:T1) and a ratio of the thickness T3 to the thickness T2 (T3:T2) are in a range of 5:1 to 20:1 respectively. In certain embodiments, the thickness T1 of the first film layer 206A and the thickness T2 the second film layer 206C are in a range of 1 nm to 5 nm, and the thickness T3 of the intermediate film layer 206B is in a range of 5 nm to 20 nm.

Figure 2C:
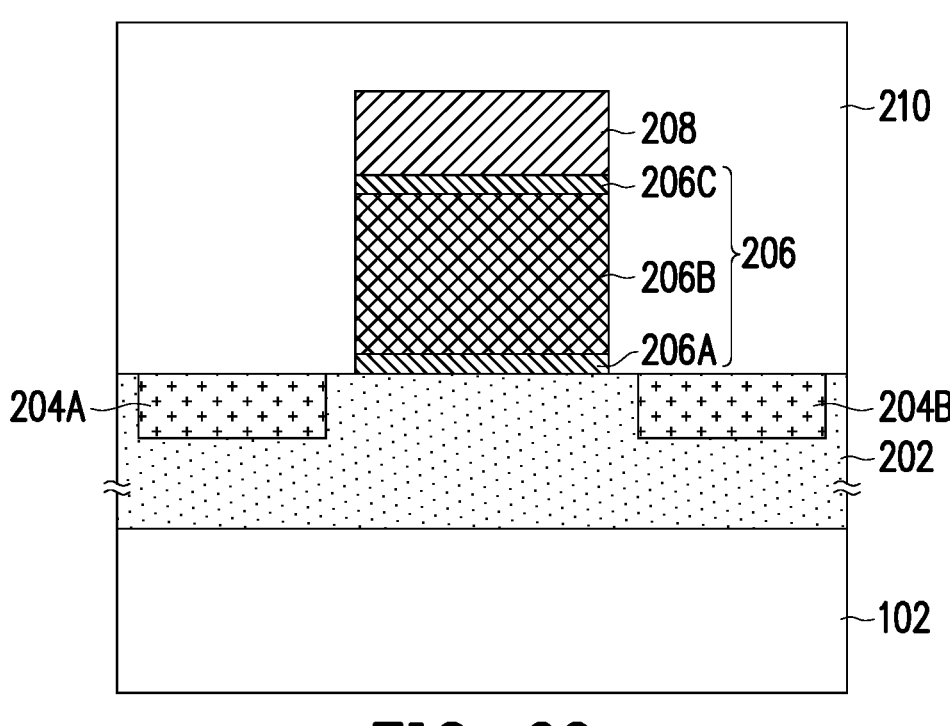

Referring to FIG. 2C, in a subsequent step, a gate electrode 208 is formed on the gate dielectric film stack 206, and stacked on top of the gate electrode 208 along the build-up direction. In some embodiments, the gate electrode 208 include conductive materials such as copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the gate electrode 208 also includes materials to fine-tune the corresponding work function. For example, the conductive material of the gate electrode 206 may include p-type work function materials such as Ru, Mo, WN, ZrSi$_2$, MoSi$_2$, TaSi$_2$, NiSi$_2$, or combinations thereof, or n-type work function materials such as Ag, TaCN, Mn, or combinations thereof. In some embodiments, the conductive material of the gate electrode 208 is deposited through ALD, CVD, PVD, or the like.

After forming the gate electrode 208, a dielectric layer 210 may be formed over the semiconductive material layer 202 to surround the gate dielectric film stack 206 and the gate electrode 208. In some embodiments, the dielectric layer 210 include materials such as polyimide, epoxy resin, acrylic resin, phenol resin, benzocyclobutene (BCB), poly-benzooxazole (PBO), or any other suitable polymer-based dielectric material. Alternatively, the dielectric layer 210 may be formed of oxides or nitrides, such as silicon oxide, silicon nitride, or the like. The dielectric layer 210 may be formed by suitable fabrication techniques such as spin-on coating, CVD, PECVD, or the like. In certain embodiments, the dielectric layer 210 corresponds to the dielectric layer 104A of the semiconductor device 100 shown in FIG. 1.

Figure 2D:
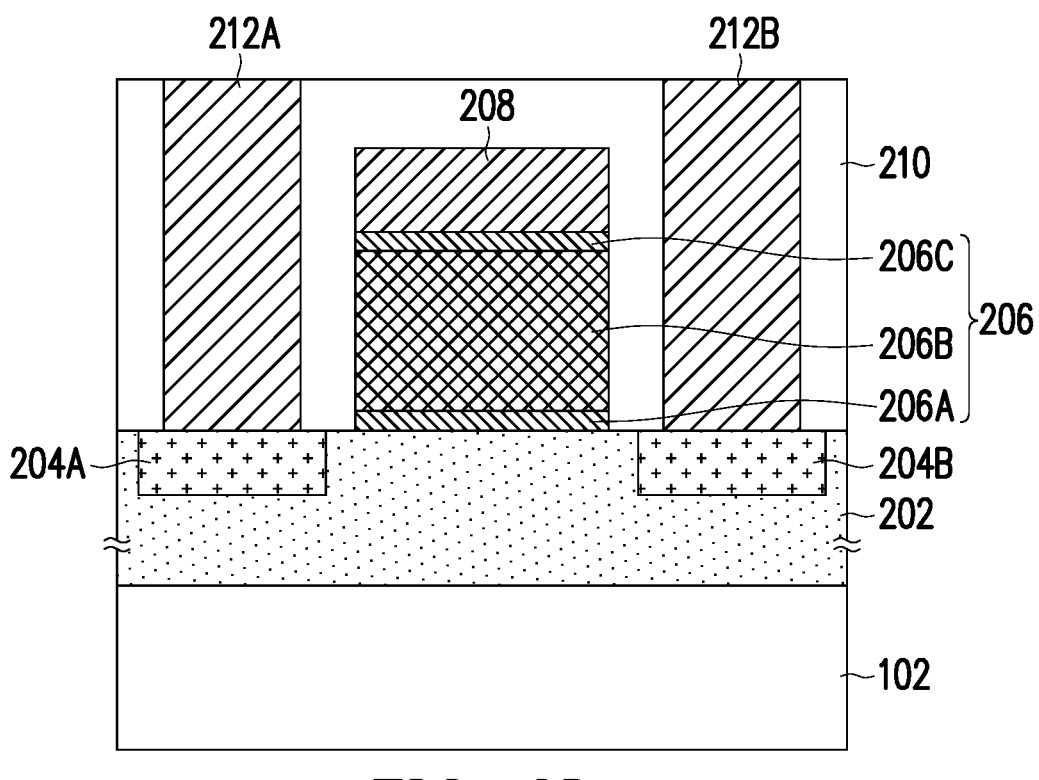

Referring to FIG. 2D, after forming the dielectric layer 210, the dielectric layer 210 may be patterned to form openings revealing the source region 204A and the drain region 204B. Thereafter, a source via 212A and a drain via 212B are formed within the opening to be connected to the source region 204A and the drain region 204B. In some embodiments, the source via 212A and the drain via 212B are surrounded by the dielectric layer 210. In certain embodiments, top surfaces of the source via 212A and the drain via 212B are aligned with a top surface of the dielectric layer 210. The source via 212A and the drain via 212B may be formed of conductive materials including copper, aluminum, tungsten, titanium nitride (TiN), tantalum nitride (TaN), some other conductive materials, or any combinations thereof. In some embodiments, the source via 212A and the drain via 212B are deposited through ALD, CVD, PVD, or the like.

Figure 2E:
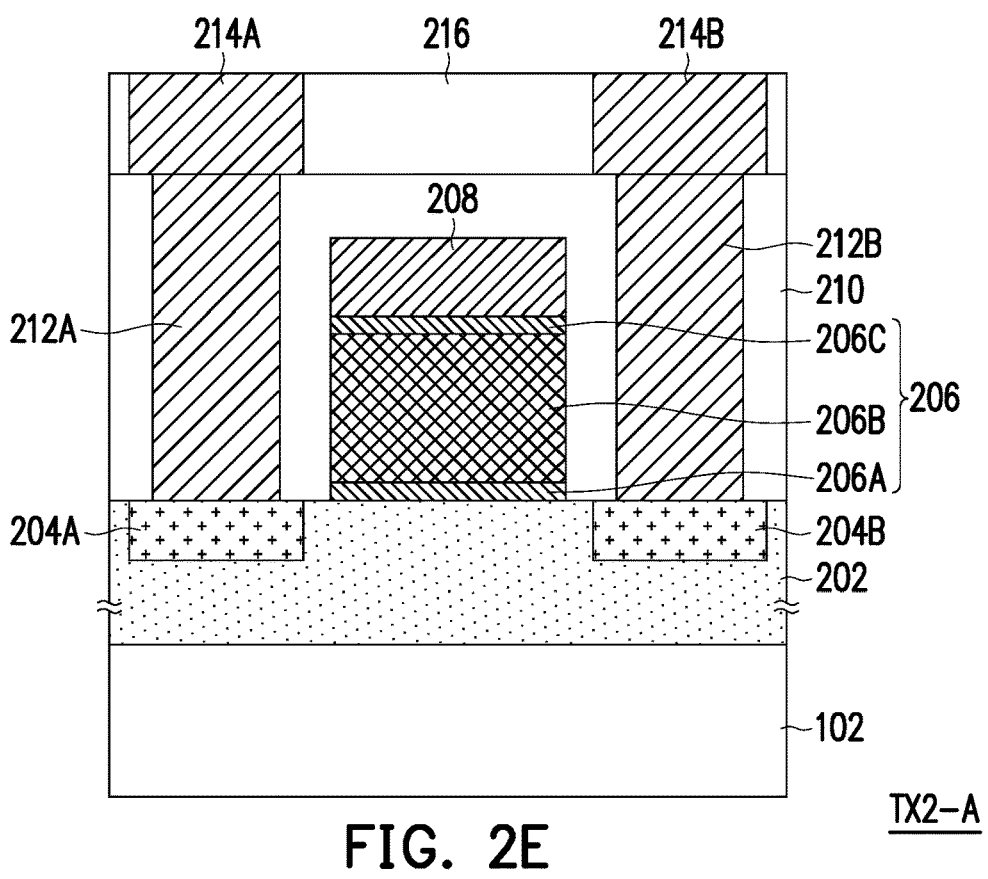

Referring to FIG. 2E, in a subsequent step, a passivation layer 216 is formed over the dielectric layer 210. The passivation layer 216 may be a silicon oxide layer, a silicon nitride layer, a silicon oxy-nitride layer, aluminum oxide layer, titanium oxide layer, or a dielectric layer formed of any suitable dielectric materials. The passivation layer 216 may be formed by CVD, PECVD, or the like. In some embodiments, the passivation layer 216 may be patterned to form openings revealing the source via 212A and the drain via 212B. Thereafter, a source contact 214A and a drain contact 214B may be formed in the openings to be electrically connected to the source via 212A and the drain via 212B.

In some embodiments, the source contact 214A and the drain contact 214B are formed by a similar material and similar process as with the source via 212A and the drain via 212B. Therefore, the details of the source contact 214A and the drain contact 214B will be omitted herein. In some embodiments, the source contact 214A and the drain contact 214B may be electrically connected to conductive layers 104B of the semiconductor device 100 shown in FIG. 1. For example, the source contact 214A and the drain contact 214B may be electrically connected to the conductive vias 104B1 of the conductive layers 104B. Up to here, a transistor TX2-A in accordance with some embodiments of the present disclosure is accomplished.

Figure 3:
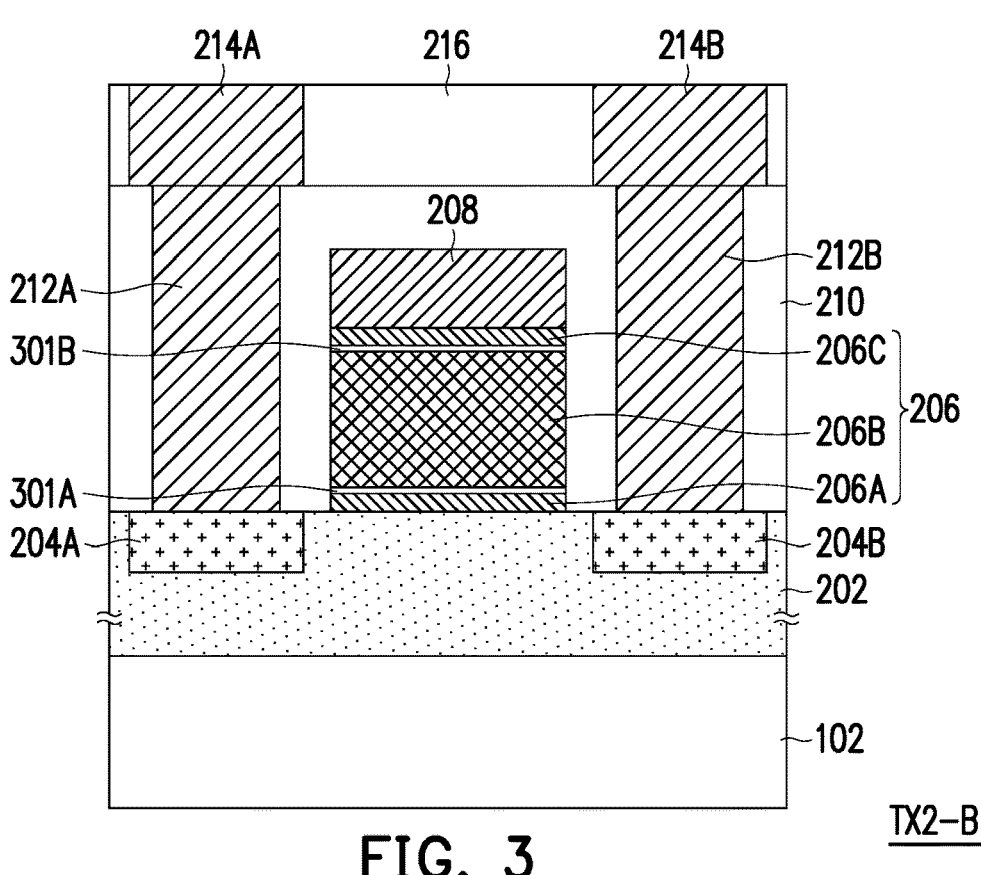
FIG. 3 is a schematic cross-sectional view of a transistor shown in FIG. 1 in accordance with some embodiments of the present disclosure.

FIG. 3 is a schematic cross-sectional view of a transistor shown in FIG. 1 in accordance with some embodiments of the present disclosure. The transistor TX2-B shown in FIG. 3 is similar to the transistor TX2-A shown in FIG. 2E. Therefore, the same reference numerals are used to refer to the same or liked parts, and its detailed description will be omitted herein. The difference between the embodiments is that the transistor TX2-B further includes auxiliary antiferroelectric induction layers 301A, 301B. For example, as illustrated in FIG. 3, in some embodiments, the transistor TX2-B includes an auxiliary antiferroelectric induction layer 301A located in between the first film layer 206A and the intermediate film layer 206B, and includes an auxiliary antiferroelectric induction layer 301B located in between the second film layer 206C and the intermediate film layer 206B.

In the exemplary embodiment, the auxiliary antiferroelectric induction layers 301A, 301B includes a material selected from the group consisting of Al$_2$O$_3$, La$_2$O$_3$, Y$_2$O$_3$, SiO$_2$, TiO$_2$ and CeO$_2$. In certain embodiments, the auxiliary antiferroelectric induction layers 301A, 301B are made of Al$_2$O$_3$ respectively. Furthermore, in some embodiments, a thickness of the auxiliary antiferroelectric induction layers 301A. 301B is in a range of 1 angstrom to 5 angstroms. By using the above materials as the auxiliary antiferroelectric induction layers 301A. 301B, and by controlling their thickness in the range of 1 angstrom to 5 angstroms, the antiferroelectricity of the gate dielectric film stack 206 can be further induced. In certain embodiments, when the thickness of the auxiliary antiferroelectric induction layers 301A, 301B is in a range of 1 angstrom to 2 angstroms, the antiferroelectricity of the gate dielectric film stack 206 can be ensured. On the other hand, if the auxiliary antiferroelectric induction layers 301A, 301B with the designated materials are made with a thickness of more than 5 angstroms, then its antiferroelectric induction properties will be loss.

Similar to the above embodiment, in the transistor TX2-B shown in FIG. 3, due to the antiferroelectric properties of the gate dielectric film stack 206 induced by the zirconium-rich HfZrO$_2$ layer (intermediate layer 206B) and the auxiliary antiferroelectric induction layers 301A, 301B, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-B.

Figures 4, 5:
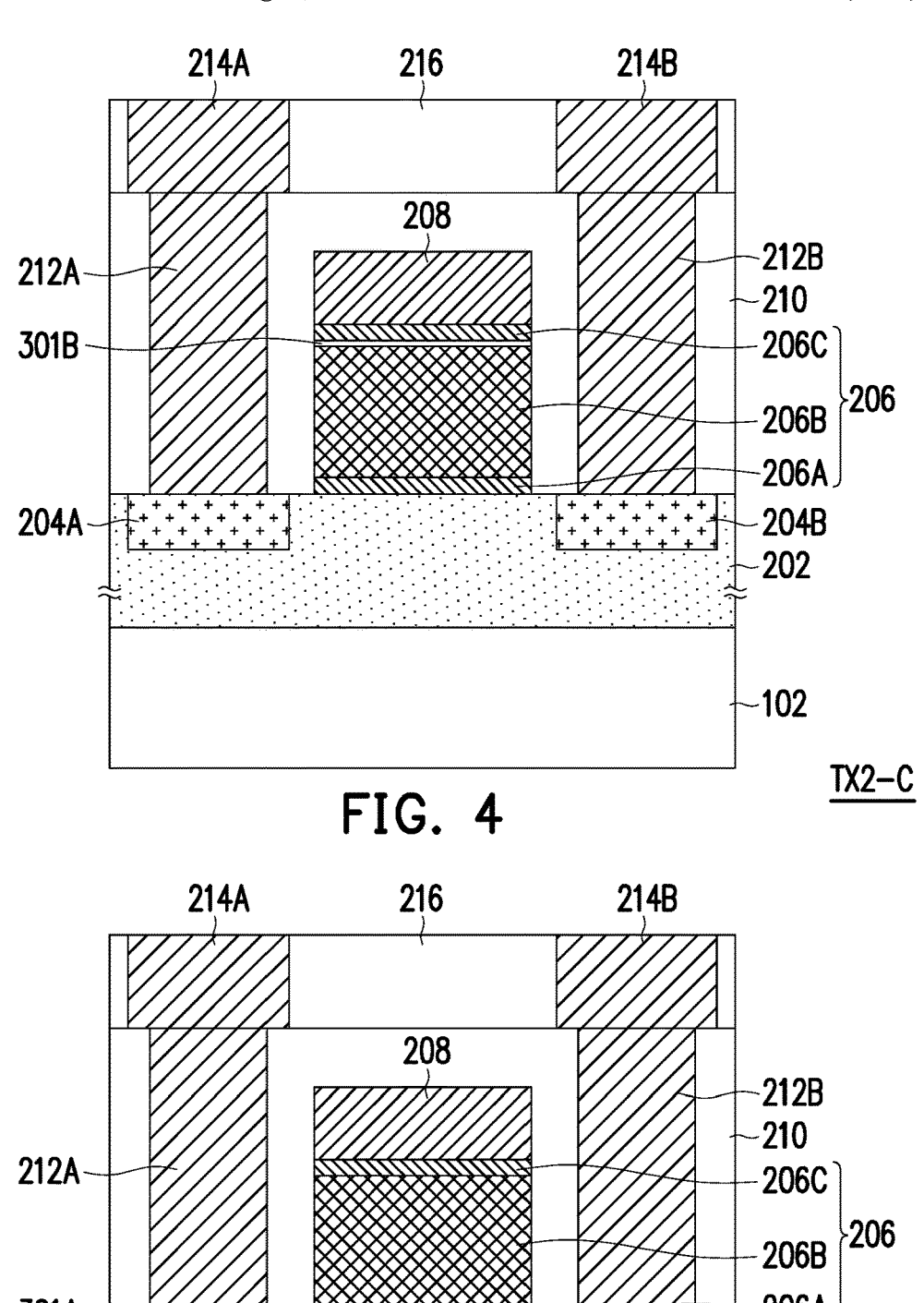
FIG. 4 is a schematic cross-sectional view of a transistor shown in FIG. 1 in accordance with some other embodiments of the present disclosure.
FIG. 5 is a schematic cross-sectional view of a transistor shown in FIG. 1 in accordance with some other embodiments of the present disclosure.

FIG. 4 is a schematic cross-sectional view of a transistor shown in FIG. 1 in accordance with some other embodiments of the present disclosure. The transistor TX2-C shown in FIG. 4 is similar to the transistor TX2-B shown in FIG. 3. Therefore, the same reference numerals are used to refer to the same or liked parts, and its detailed description will be omitted herein. The difference between the embodiments is that the auxiliary antiferroelectric induction layer 301A is omitted from the transistor TX2-C. For example, as illustrated in FIG. 4, the first film layer 206A, the intermediate layer 206B, the auxiliary antiferroelectric induction layer 301B and the second film layer 206C are sequentially stacked up over the semiconductive material layer 202 along the build-up direction.

Similar to the above embodiments, in the transistor TX2-C shown in FIG. 4, due to the antiferroelectric properties of the gate dielectric film stack 206 induced by the zirconium-rich HfZrO$_2$ layer (intermediate layer 206B) and the auxiliary antiferroelectric induction layer 301B, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-C.

FIG. 5 is a schematic cross-sectional view of a transistor shown in FIG. 1 in accordance with some other embodiments of the present disclosure. The transistor TX2-D shown in FIG. 5 is similar to the transistor TX2-B shown in FIG. 3. Therefore, the same reference numerals are used to refer to the same or liked parts, and its detailed description will be omitted herein. The difference between the embodiments is that the auxiliary antiferroelectric induction layer 301B is omitted from the transistor TX2-D. For example, as illustrated in FIG. 4, the first film layer 206A, the auxiliary antiferroelectric induction layer 301A, the intermediate layer 206B, and the second film layer 206C are sequentially stacked up over the semiconductive material layer 202 along the build-up direction.

Similar to the above embodiments, in the transistor TX2-D shown in FIG. 5, due to the antiferroelectric properties of the gate dielectric film stack 206 induced by the zirconium-rich HfZrO$_2$ layer (intermediate layer 206B) and the auxiliary antiferroelectric induction layer 301A, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-D.

Figure 6:
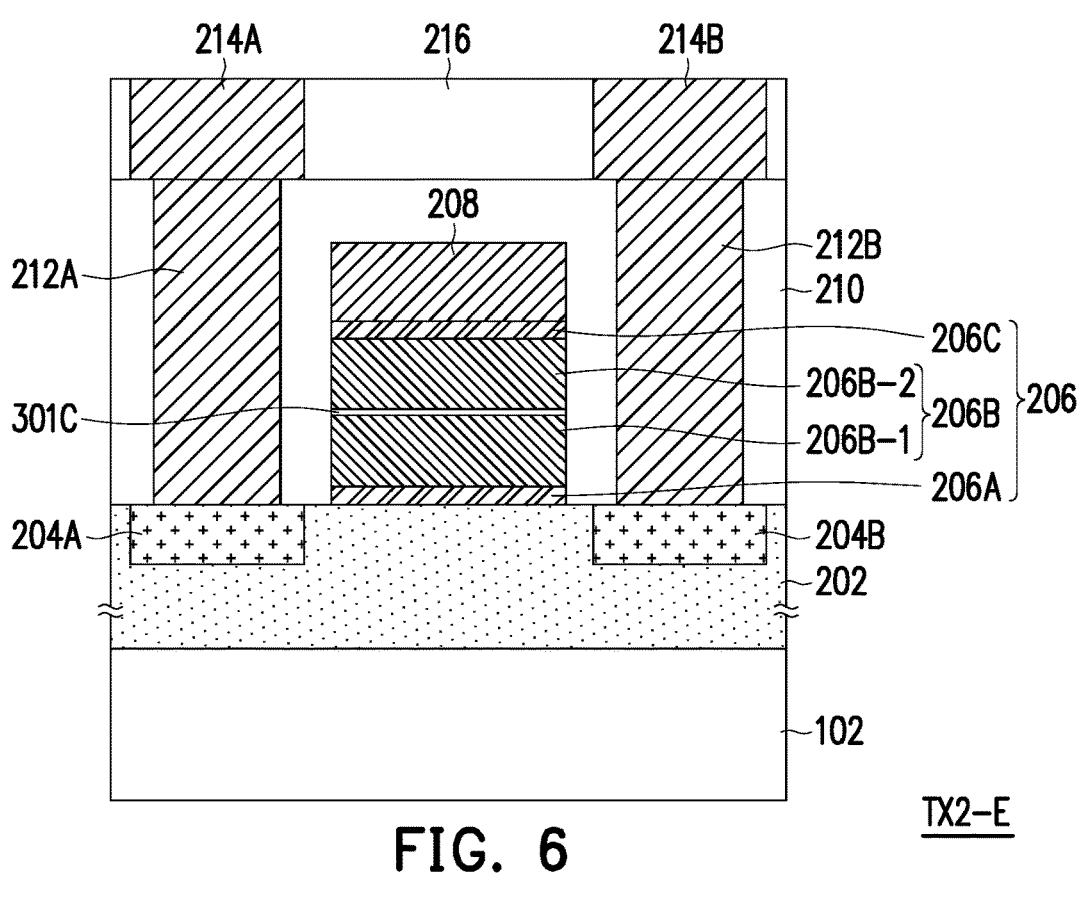
FIG. 6 is a schematic cross-sectional view of a transistor shown in FIG. 1 in accordance with some other embodiments of the present disclosure.

FIG. 6 is a schematic cross-sectional view of a transistor shown in FIG. 1 in accordance with some other embodiments of the present disclosure. The transistor TX2-E shown in FIG. 5 is similar to the transistor TX2-B shown in FIG. 3. Therefore, the same reference numerals are used to refer to the same or liked parts, and its detailed description will be omitted herein. The difference between the embodiments is in the design of the gate dielectric film stack 206.

As illustrated in FIG. 6, in some embodiments, the gate dielectric film stack 206 includes the first film layer 206A, the intermediate layer 206B and the second film layer 206C stacked up over the semiconductive material layer 202 along the build-up direction. In some embodiments, the first film layer 206A and the second film layer 206C comprises Hf$_X$Zr$_{(1-X)}$O$_2$, and wherein X is in a range of 0.7 to 1, and the intermediate film layer 206B comprises Hf$_Y$Zr$_{(1-Y)}$O$_2$, and wherein Y is in a range of 0.5 to 0.7. It is noted that in the case where X is 1, then Hf$_X$Zr$_{(1-X)}$O$_2$ is hafnium oxide (HfO), and zirconium is omitted. In the above embodiment, the first film layer 206A and the second film layer 206C and the intermediate layer 206B are all hafnium-rich layers, however, a hafnium content of the intermediate film layer 206B is lower than a hafnium content of the first film layer 206A and a hafnium content of the second film layer 206C. For example, in one embodiment, the first film layer 206A and the second film layer 206C includes Hf$_{0.8}$Zr$_{0.2}$O$_2$, while the intermediate layer 206B includes Hf$_{0.6}$Zr$_{0.4}$O$_2$.

In the exemplary embodiment, the first film layer 206A, the second film layer 206C and the intermediate layer 206B has a monoclinic phase crystallinity. In some embodiments, to induce the antiferroelectric properties of the film stack, the intermediate film layer 206B is separated into a first sub-layer 206B-1 and a second sub-layer 206B-2, and an antiferroelectric induction layer 301C is sandwiched between the first sub-layer 206B-1 and the second sub-layer 206B-2. For example, the first sub-layer 206B-1 is in contact with the first film layer 206A, while the second sub-layer 206B-2 is in contact with the second film layer. Furthermore, the antiferroelectric induction layer 301C is directly contacting the first sub-layer 206B-1 and the second sub-layer 206B-2.

In some embodiments, the antiferroelectric induction layer 301C includes a material selected from the group consisting of Al$_2$O$_3$, La$_2$O$_3$, Y$_2$O$_3$, SiO$_2$, TiO$_2$ and CeO$_2$. In certain embodiments, the antiferroelectric induction layer 301C is made of Al$_2$O$_3$. Furthermore, in some embodiments, a thickness of the antiferroelectric induction layer 301C is in a range of 1 angstrom to 5 angstroms. By using the above materials as the antiferroelectric induction layer 301C, and by controlling their thickness in the range of 1 angstrom to 5 angstroms, the antiferroelectricity of the gate dielectric film stack 206 can be induced. In certain embodiments, when the thickness of the antiferroelectric induction layer 301C is in a range of 1 angstrom to 2 angstroms, the antiferroelectricity of the gate dielectric film stack 206 can be ensured. On the other hand, if the antiferroelectric induction layer 301C with the designated materials are made with a thickness of more than 5 angstroms, then its antiferroelectric induction properties will be loss.

Similar to the above embodiments, in the transistor TX2-E shown in FIG. 6, due to the antiferroelectric properties of the gate dielectric film stack 206 induced by the antiferroelectric induction layer 301C, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-E.

Figure 7:
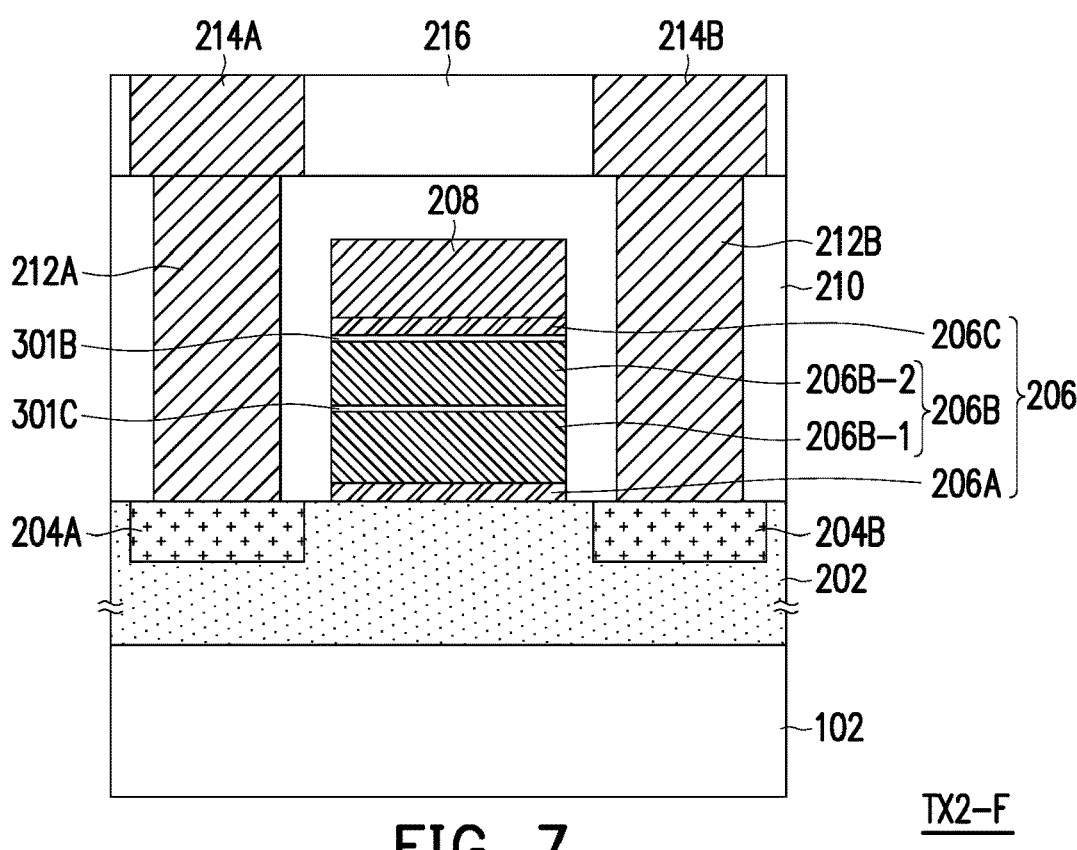
FIG. 7 is a schematic cross-sectional view of a transistor shown in FIG. 1 in accordance with some other embodiments of the present disclosure.

FIG. 7 is a schematic cross-sectional view of a transistor shown in FIG. 1 in accordance with some other embodiments of the present disclosure. The transistor TX2-F shown in FIG. 7 is similar to the transistor TX2-E shown in FIG. 6. Therefore, the same reference numerals are used to refer to the same or liked parts, and its detailed description will be omitted herein. The difference between the embodiments is that the transistor TX2-F further includes an auxiliary antiferroelectric induction layer 301B. For example, as illustrated in FIG. 7, the first film layer 206A, the first sub-layer 206B-1 of the intermediate layer 206B, the antiferroelectric induction layer 301C, the second sub-layer 206B-2 of the intermediate layer 206B, the auxiliary antiferroelectric induction layer 301B and the second film layer 206C are sequentially stacked up over the semiconductive material layer 202 along the build-up direction.

Similar to the above embodiments, in the transistor TX2-F shown in FIG. 7, due to the antiferroelectric properties of the gate dielectric film stack 206 induced by the antiferroelectric induction layer 301C and the auxiliary antiferroelectric induction layer 301B, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-F.

Figure 8:
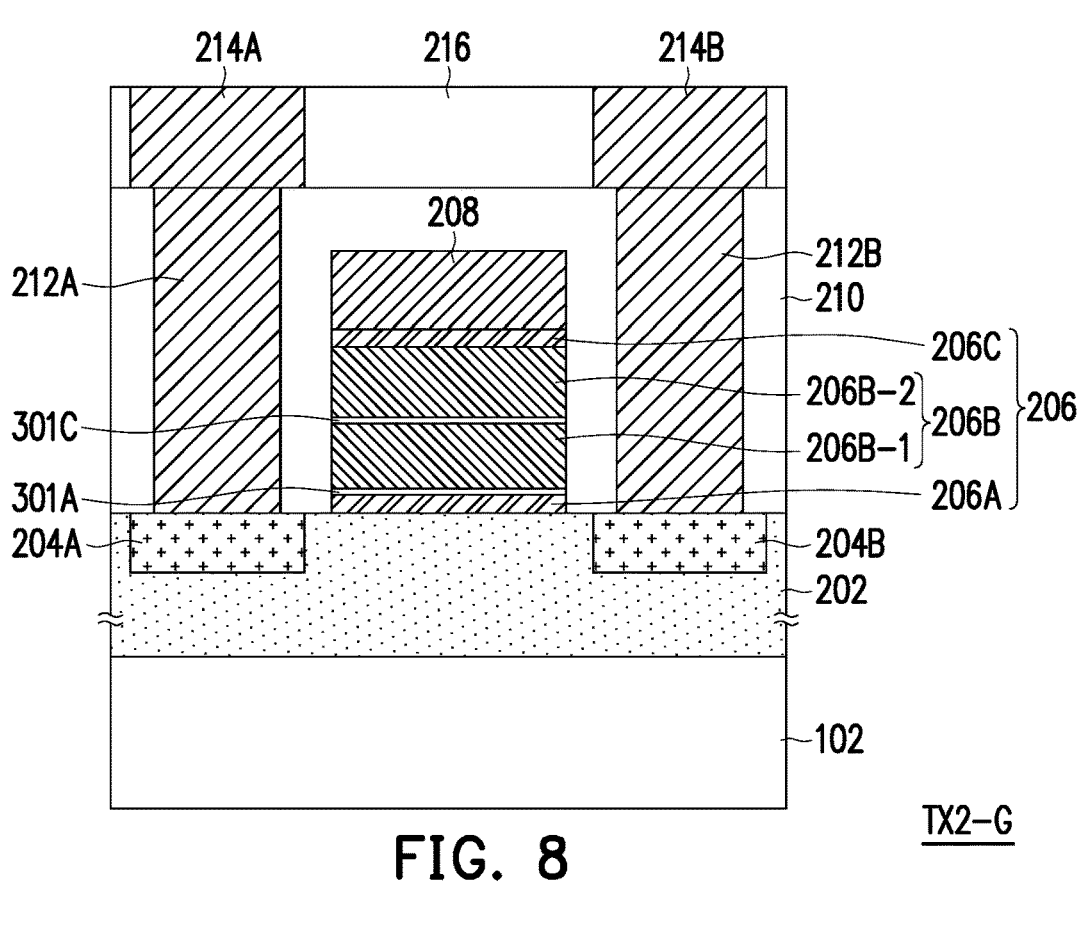
FIG. 8 is a schematic cross-sectional view of a transistor shown in FIG. 1 in accordance with some other embodiments of the present disclosure.

FIG. 8 is a schematic cross-sectional view of a transistor shown in FIG. 1 in accordance with some other embodiments of the present disclosure. The transistor TX2-G shown in FIG. 8 is similar to the transistor TX2-E shown in FIG. 6. Therefore, the same reference numerals are used to refer to the same or liked parts, and its detailed description will be omitted herein. The difference between the embodiments is that the transistor TX2-G further includes an auxiliary antiferroelectric induction layer 301A. For example, as illustrated in FIG. 8, the first film layer 206A, the auxiliary antiferroelectric induction layer 301A, the first sub-layer 206B-1 of the intermediate layer 206B, the antiferroelectric induction layer 301C, the second sub-layer 206B-2 of the intermediate layer 206B, and the second film layer 206C are sequentially stacked up over the semiconductive material layer 202 along the build-up direction.

Similar to the above embodiments, in the transistor TX2-G shown in FIG. 8, due to the antiferroelectric properties of the gate dielectric film stack 206 induced by the antiferroelectric induction layer 301C and the auxiliary antiferroelectric induction layer 301A, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-G.

Figure 9:
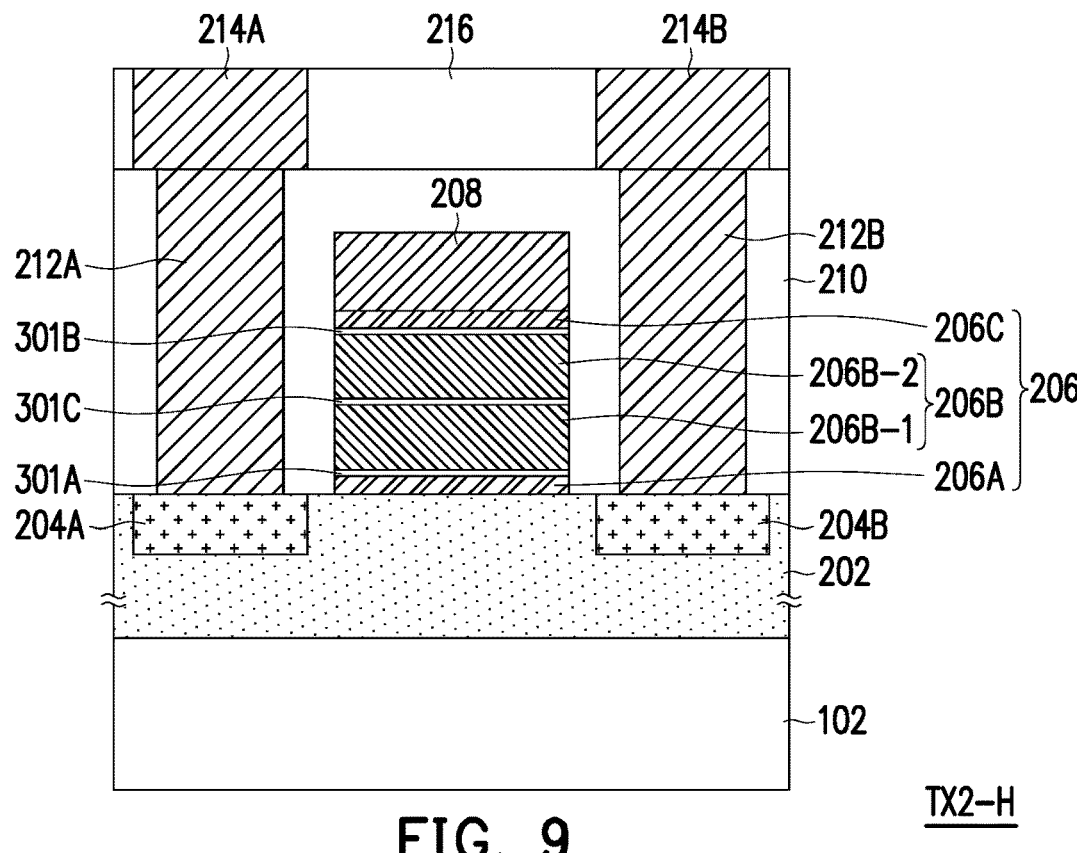
FIG. 9 is a schematic cross-sectional view of a transistor shown in FIG. 1 in accordance with some other embodiments of the present disclosure.

FIG. 9 is a schematic cross-sectional view of a transistor shown in FIG. 1 in accordance with some other embodiments of the present disclosure. The transistor TX2-H shown in FIG. 9 is similar to the transistor TX2-E shown in FIG. 6. Therefore, the same reference numerals are used to refer to the same or liked parts, and its detailed description will be omitted herein. The difference between the embodiments is that the transistor TX2-H further includes auxiliary antiferroelectric induction layers 301A, 301B. For example, as illustrated in FIG. 9, the first film layer 206A, the auxiliary antiferroelectric induction layer 301A, the first sub-layer 206B-1 of the intermediate layer 206B, the antiferroelectric induction layer 301C, the second sub-layer 206B-2 of the intermediate layer 206B, the auxiliary antiferroelectric induction layer 301B, and the second film layer 206C are sequentially stacked up over the semiconductive material layer 202 along the build-up direction.

Similar to the above embodiments, in the transistor TX2-H shown in FIG. 9, due to the antiferroelectric properties of the gate dielectric film stack 206 induced by the antiferroelectric induction layer 301C and the auxiliary antiferroelectric induction layers 301A, 301B, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-H.

Figure 10:
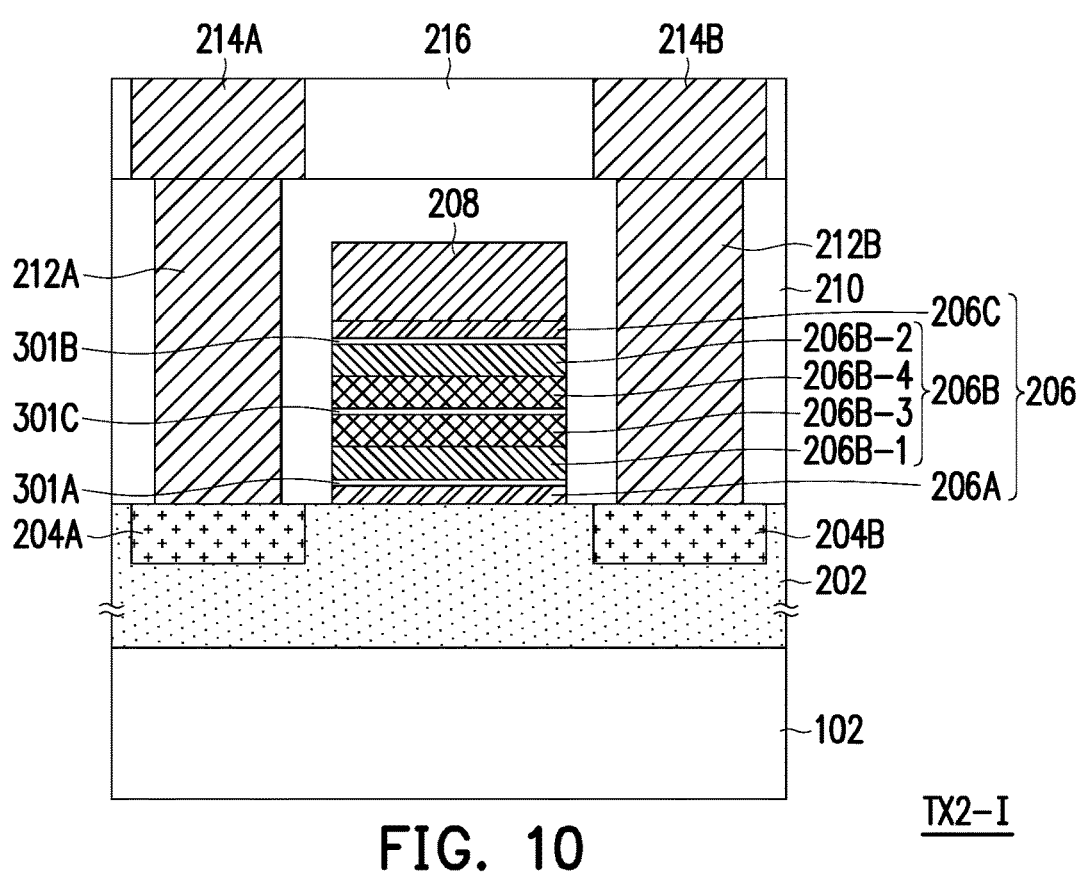
FIG. 10 is a schematic cross-sectional view of a transistor shown in FIG. 1 in accordance with some other embodiments of the present disclosure.

FIG. 10 is a schematic cross-sectional view of a transistor shown in FIG. 1 in accordance with some other embodiments of the present disclosure. The transistor TX2-I shown in FIG. 10 is similar to the transistor TX2-H shown in FIG. 9. Therefore, the same reference numerals are used to refer to the same or liked parts, and its detailed description will be omitted herein. The difference between the embodiments is in the design of the intermediate film layer 206B. As illustrated in FIG. 10, the intermediate film layer 206B is separated into a first sub-layer 206B-1, a second sub-layer 206B-2, a third sub-layer 206B-3 and a fourth sub-layer 206B-4. For example, the first sub-layer 206B-1 is in contact with the first film layer 206A, the second sub-layer 206B-2 is in contact with the second film layer, the third sub-layer 206B-3 is in contact with the first sub-layer 206B-1, the fourth sub-layer 206B-4 is in contact with the second sub-layer 206N-2, and wherein the antiferroelectric induction layer 301C is sandwiched between the third sub-layer 206B-3 and the fourth sub-layer 206B-4.

In the exemplary embodiment, the first film layer 206A and the second film layer 206C comprises $Hf_XZr_{(1-x)}O_2$, and wherein X is in a range of 0.7 to 1, and the intermediate film layer 206B comprises $Hf_YZr_{(1-Y)}O_2$, and wherein Y is in a range of 0.5 to 0.7. However, in the intermediate film layer 206B, the hafnium contents of the third sub-layer 206B-3 and the fourth sub-layer 206B-4 are lower than the hafnium contents of the first sub-layer 206B-1 and the second sub-layer 206B2. For example, in one embodiment, the first film layer 206A and the second film layer 206C includes $Hf_{0.9}Zr_{0.1}O_2$, the first sub-layer 206B-1 and the second sub-layer 206B2 includes $Hf_{0.7}Zr_{0.3}O_2$, and the third sub-layer 206B-3 and the fourth sub-layer 206B-4 includes $Hf_{0.5}Zr_{0.5}O_2$.

Similar to the above embodiments, in the transistor TX2-I shown in FIG. 10, due to the antiferroelectric properties of the gate dielectric film stack 206 induced by the antiferroelectric induction layer 301C and the auxiliary antiferroelectric induction layers 301A, 301B, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-I.

Figure 11:
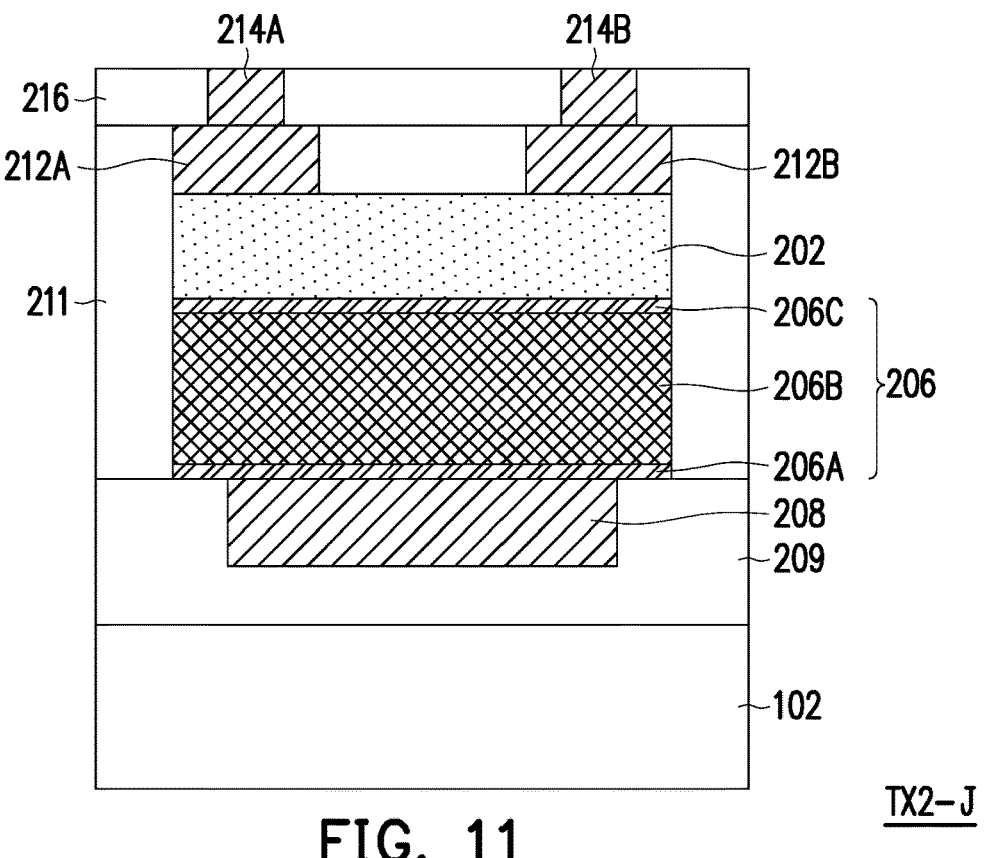
FIG. 11 is a schematic cross-sectional view of a transistor shown in FIG. 1 in accordance with some other embodiments of the present disclosure.

FIG. 11 is a schematic cross-sectional view of a transistor shown in FIG. 1 in accordance with some other embodiments of the present disclosure. In the above embodiments, the transistors are formed in a top-gate manner, however, the disclosure is not limited thereto. As illustrated in FIG. 11, the transistor TX2J is formed in a bottom-gate manner. For example, referring to FIG. 11, a gate electrode 208 is formed in a dielectric layer 209. The dielectric layer 209 may correspond to the dielectric layers 104A located any level of the interconnection layer 104 shown in FIG. 1. The gate electrode 208 may be formed by the same material and by the same method as described in previous embodiments, thus its details will not be repeated herein.

After forming the gate electrode 208, a gate dielectric film stack 206 is formed over the gate electrode 208. For example, forming the gate dielectric film stack 206 includes sequentially forming the first film layer 206A, the intermediate film layer 206B and the second film layer 206C stacked up along a build-up direction. In the exemplary embodiment, a hafnium content of the intermediate film layer 206B is lower than a hafnium content of the first film layer 206A and a hafnium content of the second film layer 206C. For example, in some embodiments, the first film layer 206A and the second film layer 206C comprises $Hf_XZr_{(1-X)}O_2$, and wherein X is in a range of 0.5 to 0.7. Furthermore, in some embodiments, the intermediate film layer 206B comprises $Hf_YZr_{(1-Y)}O_2$, and wherein Y is in a range of 0.3 to 0.5. In one exemplary embodiment, the first film layer 206A and the second film layer 206C includes $Hf_{0.7}Zr_{0.3}O_2$, while the intermediate layer 206B includes $Hf_{0.3}Zr_{0.7}O_2$. In other words, the first film layer 206A and the second film layer 206C are hafnium-rich $HfZrO_2$ layers, while the intermediate layer 206B is a zirconium-rich $HfZrO_2$ layer.

In some embodiments, a semiconductive material layer 202 is formed on the gate dielectric film stack 206, and a dielectric layer 211 is formed to surround the gate dielectric film stack 206 and the semiconductive material layer 202. For example, the dielectric layer 211 may correspond to the dielectric layers 104A of the interconnection layer 104 shown in FIG. 1. In some embodiments, after forming the dielectric layer 211, the dielectric layer 211 is patterned to form openings revealing the semiconductive material layer 202. Thereafter, a source via 212A and a drain via 212B are formed within the opening to be connected to semiconductive material layer 202. In a subsequent step, a passivation layer 216 is formed over the dielectric layer 211, and a source contact 214A and a drain contact 214B may be formed in the passivation layer 216 to be electrically connected to the source via 212A and the drain via 212B. In the exemplary embodiment, the semiconductive material layer 202, the source via 212A, the drain via 212B, the source contact 214A, the drain contact 214 as well as the passivation layer 216 are formed by the same methods and by the same materials described in the above embodiments, thus its details will not be repeated herein. Up to here, a transistor TX2-J in accordance with some embodiments of the present disclosure is accomplished.

Similar to the above embodiments, in the transistor TX2-J shown in FIG. 11, due to the antiferroelectric properties of the gate dielectric film stack 206 induced by the zirconium-rich $HfZrO_2$ layer (intermediate layer 206B), the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-J.

Figure 12:
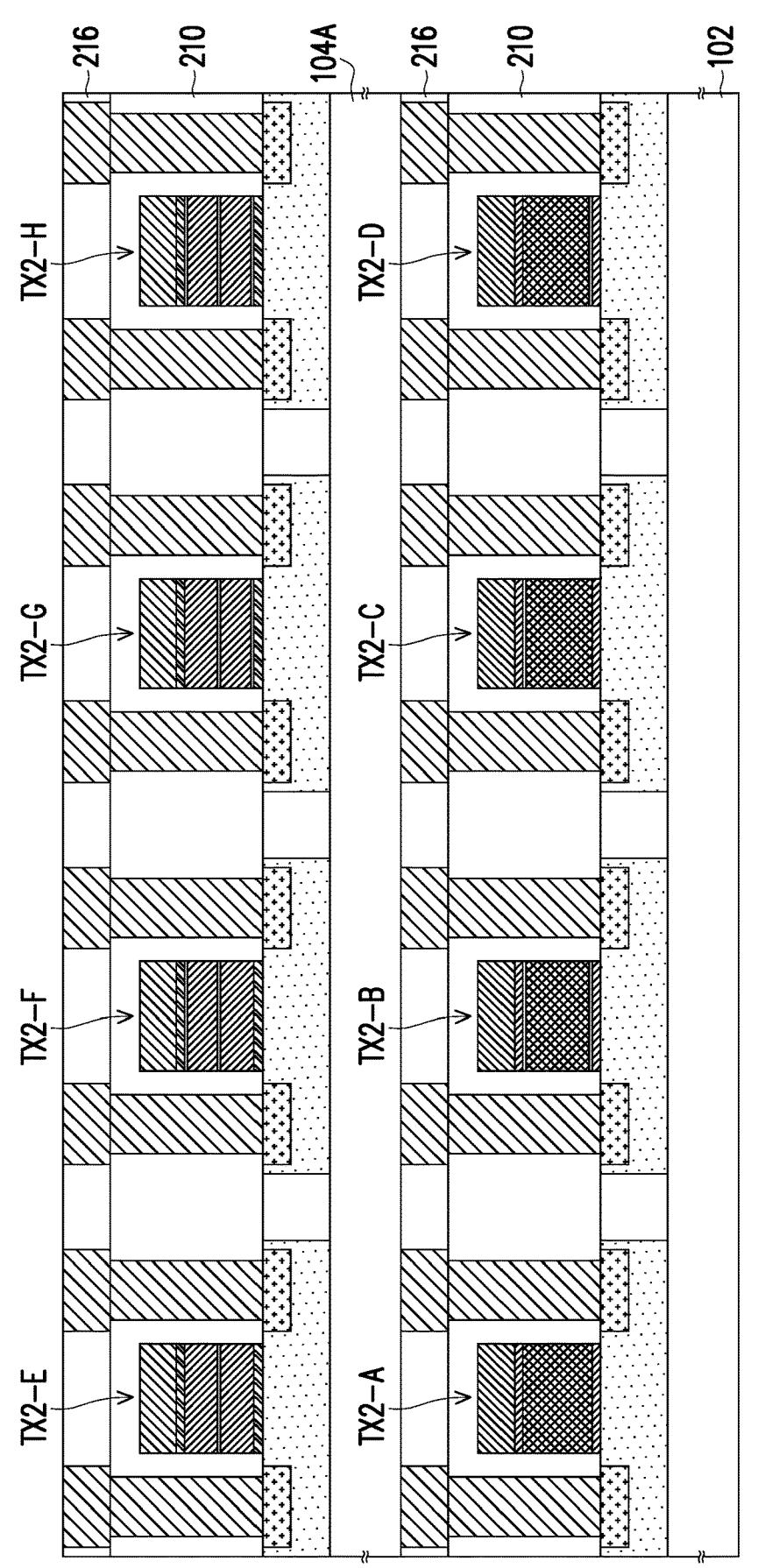
FIG. 12 is a schematic cross-sectional view of a transistor array included in the semiconductor device shown in FIG. 1 in accordance with some embodiments of the present disclosure.

FIG. 12 is a schematic cross-sectional view of a transistor array included in the semiconductor device shown in FIG. 1 in accordance with some embodiments of the present disclosure. As illustrated in FIG. 1, the semiconductor device 100 includes a plurality of transistors TX2 in the interconnection layer 104. In some embodiments, the transistors TX2 may be any of the transistors TX2-A, TX2-B, TX2-C, TX2-D, TX2-E, TX2-F. TX2-G, TX2-H, TX2-I and TX2-J described above. For example, in one embodiment, the transistors TX2 may be arranged as a transistor array TRI as shown in FIG. 12.

As illustrated in FIG. 12, in some embodiments, the transistor array TRI shown in FIG. 12 may include a plurality of transistors TX2 arranged in an array. For example, in some embodiments, the transistors TX2-A, TX2-B. TX2-C. TX2-D are arranged in one row of the interconnection layer 104, while the transistors TX2-E, TX2-F, TX2-G, TX2-H are arranged in another of the interconnection layer 104. In the exemplary embodiment, the transistor TX2-A may be a first transistor, the transistor TX2-B may be a second transistor, the transistor TX2-C may be a third transistor, the transistor TX2-D may be a fourth transistor, the transistor TX2-E may be a fifth transistor, the transistor TX2-F may be a sixth transistor, the transistor TX2-G may be a seventh transistor, and the transistor TX2-H may be an eighth transistor. Although the transistor array TRI are shown to include eight different type of transistors TX2-A~TX2-H, the present disclosure is not limited thereto. For example, in some other embodiments, the transistor array may include a plurality of each type of the transistors TX2-A, TX2-B. TX2-C, TX2-D, TX2-E. TX2-F. TX2-G, TX2-H, TX2-I and TX2-J described above.

Similar to the embodiments above, in the transistor array TRI shown in FIG. 12, due to the antiferroelectric properties of the gate dielectric film stack 206 of the transistors TX2-A~TX2-H induced by the zirconium-rich $HfZrO_2$ layer (intermediate layer 206B), the antiferroelectric induction layer 301C and/or the auxiliary antiferroelectric induction layers 301A. 301B, the polarization switching potential barrier of the film stack is lowered, and a higher endurance can be obtained. Furthermore, with the antiferroelectric properties of the gate dielectric film stack 206, the positive half of the ferroelectric polarization-voltage (P-V) hysteresis loop can be used to positively shift the threshold voltage of the FeFET, making it easier to turn off the transistor TX2-A~TX2-H.

According to the above embodiments, the semiconductor device includes a gate dielectric film stack having at least a zirconium-rich $HfZrO_2$ layer, or antiferroelectric induction layers for inducing the antiferroelectricity of the film stack. As such, the polarization switching potential barrier of the film stack of the transistor is lowered, and a higher endurance can be obtained. Furthermore, with the antiferroelectric properties of the gate dielectric film stack, the positive half of the ferroelectric polarization-voltage (P-V) hysteresis loop can be used to positively shift the threshold voltage of the FeFET, making it easier to turn off the transistor. Overall, the semiconductor device may have improved performance.

In accordance with some embodiments of the present disclosure, a semiconductor device includes a first transistor. The first transistor includes a source region, a drain region, a semiconductive material layer, a gate dielectric film stack and a gate electrode. The semiconductive material layer is disposed between the source region and the drain region. The gate dielectric film stack is disposed on the semiconductive material layer and includes a first film layer, a second film layer and an intermediate film layer. The first film layer and the second film layer include hafnium. The intermediate layer is sandwiched in between the first film layer and the second film layer and includes hafnium, wherein a hafnium content of the intermediate film layer is lower than a hafnium content of the first film layer and a hafnium content of the second film layer. The gate electrode is disposed on the gate dielectric film stack.

In accordance with some other embodiments of the present disclosure, a semiconductor device includes a substrate, an interconnection layer, a transistor array and conductive terminals. The interconnection layer is disposed on the substrate, wherein the interconnection layer includes a plurality of dielectric layers and a plurality of conductive layers alternately stacked up along a build-up direction. The transistor array is located in between the plurality of dielectric layers, wherein the transistor array includes a first transistor. The first transistor includes a semiconductive material layer, a source region and a drain region, a gate dielectric film stack and a gate electrode. The source region and the drain region are located on two sides of the semiconductor material layer. The gate dielectric film stack and the gate electrode are sequentially stacked over the semiconductive material layer along the build-up direction, wherein the gate dielectric film stack includes a plurality of hafnium-based layers, and a hafnium content of the plurality of hafnium-based layers increases from a center of the gate dielectric film stack to top and bottom surfaces of the gate dielectric film stack. The conductive terminals are disposed on and electrically connected to the interconnection layer.

In accordance with yet another embodiment of the present disclosure, a method of fabricating a semiconductor device is described. The method includes forming a first transistor over a substrate, wherein forming the first transistor includes the following steps. A semiconductive material layer disposed over the substrate is formed. A source region and a drain region is formed, wherein the semiconductive material layer is disposed between the source region and the drain region. A gate dielectric film stack disposed on the semiconductive material layer is formed, wherein forming the gate dielectric film stack includes forming a first film layer, forming an intermediate film layer, and forming a second film layer. The intermediate layer is formed on the first film layer. The second film layer is formed on the intermediate film layer, wherein the intermediate film layer is sandwiched in between the first film layer and the second film layer, and wherein a hafnium content of the intermediate film layer is lower than a hafnium content of the first film layer and a hafnium content of the second film layer. The gate electrode is formed on the gate dielectric film stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first transistor, comprising:
   a source region and a drain region;
   a semiconductive material layer disposed between the source region and the drain region;
   a gate dielectric film stack disposed on the semiconductive material layer and comprising:
      a first film layer comprising hafnium and having a thickness of T1, wherein the first film layer is directly contacting the semiconductive material layer;
      a second film layer comprising hafnium and having a thickness of T2; and
      an intermediate film layer sandwiched in between the first film layer and the second film layer and comprising hafnium, and having a thickness of T3, wherein a hafnium content of the intermediate film layer is lower than a hafnium content of the first film layer and a hafnium content of the second film layer, and wherein a ratio of the thickness T3 to the thickness T1 is in a range of 5:1 to 20:1, and a ratio of the thickness T3 to the thickness T2 is in a range of 5:1 to 20:1; and
   a gate electrode disposed on the gate dielectric film stack, and directly contacting the second film layer.

2. The semiconductor device according to claim 1, wherein the first film layer and the second film layer comprises $Hf_XZr_{(1-X)}O_2$, and wherein X is in a range of 0.5 to 0.7.

3. The semiconductor device according to claim 1, wherein the intermediate film layer comprises $Hf_YZr_{(1-Y)}O_2$, and wherein Y is in a range of 0.3 to 0.5.

4. The semiconductor device according to claim 1, wherein the first film layer and the second film layer comprises $Hf_XZr_{(1-X)}O_2$, and wherein X is in a range of 0.7 to 1, and the intermediate film layer comprises $Hf_YZr_{(1-Y)}O_2$, and wherein Y is in a range of 0.5 to 0.7.

5. The semiconductor device according to claim 1, wherein the intermediate film layer comprises a first sub-layer in contact with the first film layer and a second sub-layer in contact with the second film layer, and wherein an antiferroelectric induction layer is sandwiched between the first sub-layer and the second sub-layer.

6. The semiconductor device according to claim 5, wherein a thickness of the antiferroelectric induction layer is in a range of 1 angstrom to 5 angstroms.

7. The semiconductor device according to claim 5, wherein the antiferroelectric induction layer includes a material selected from the group consisting of $Al_2O_3$, $La_2O_3$, $Y_2O_3$, $SiO_2$, $TiO_2$ and $CeO_2$.

8. The semiconductor device according to claim 1, further comprising auxiliary antiferroelectric induction layers located in between the first film layer and the intermediate film layer, and located in between the second film layer and the intermediate film layer.

9. The semiconductor device according to claim 1, wherein sidewalls of the gate electrode are aligned with sidewalls of the first film layer, aligned with sidewalls of the second film layer, and aligned with sidewalls of the intermediate film layer.

10. The semiconductor device according to claim 1, further comprising:
   a source via connected to the source region;
   a drain via connected to the drain region, wherein the first film layer, the second film layer and the intermediate film layer are located in between the source via and the drain via; and
   a dielectric layer laterally surrounding the source via, the drain via, the gate dielectric film stack and the gate electrode.

11. A semiconductor device, comprising:
a substrate;
an interconnection layer disposed on the substrate, wherein the interconnection layer comprises a plurality of dielectric layers and a plurality of conductive layers alternately stacked up along a build-up direction;
a transistor array located in between the plurality of dielectric layers, wherein the transistor array comprises a first transistor, and the first transistor comprises:
   a semiconductive material layer;
   a source region and a drain region located on two sides of the semiconductor material layer;
   a gate dielectric film stack and a gate electrode sequentially stacked over the semiconductive material layer along the build-up direction, wherein the gate dielectric film stack comprises a plurality of hafnium-based layers, and a hafnium content of the plurality of hafnium-based layers increases from a center of the gate dielectric film stack to top and bottom surfaces of the gate dielectric film stack, and the plurality of hafnium-based layers comprises a first film layer, an intermediate film layer and a second film layer stacked up in sequence along the build-up direction, and the hafnium content of the intermediate layer is lower than the hafnium content of the first film layer and the hafnium content of the second film layer, wherein the first film layer and the second film layer comprises $Hf_XZr_{(1-X)}O_2$, and wherein X is in a range of 0.7 to 1, and the intermediate film layer comprises $Hf_YZr_{(1-Y)}O_2$, and wherein Y is in a range of 0.5 to 0.7; and conductive terminals disposed on and electrically connected to the interconnection layer.

12. The semiconductor device according to claim 11, wherein the intermediate film layer comprises a first sub-layer in contact with the first film layer and a second sub-layer in contact with the second film layer, and wherein an antiferroelectric induction layer is sandwiched between the first sub-layer and the second sub-layer.

13. The semiconductor device according to claim 9, wherein a thickness of the first film layer and a thickness the second film layer are in a range of 1 nm to 5 nm, and a thickness of the intermediate film layer is in a range of 5 nm to 20 nm, and the thickness of the intermediate film layer is greater than the thickness of the first film layer and the thickness of the second film layer.

14. The semiconductor device according to claim 9, wherein the transistor array further comprises a second transistor, wherein the second transistor comprises:

a second semiconductive material layer;

a second source region and a second drain region located on two sides of the second semiconductor material layer;

a second gate dielectric film stack and a second gate electrode sequentially stacked over the second semiconductive material layer along the build-up direction, wherein the second gate dielectric film comprises two hafnium-rich $HfZrO_2$ layers, and a zirconium-rich $HfZrO_2$ layer sandwiched between the two hafnium-rich $HfZrO_2$ layers.

15. The semiconductor device according to claim 11, further comprising: a first auxiliary antiferroelectric induction layer located in between the first film layer and the intermediate film layer, wherein the first auxiliary antiferroelectric induction layer is directly contacting the first film layer and the intermediate film layer; a second auxiliary antiferroelectric induction layer located in between the second film layer and the intermediate film layer, wherein the second auxiliary antiferroelectric induction layer is directly contacting the second film layer and the intermediate film layer, and wherein the first auxiliary antiferroelectric induction layer and the second auxiliary antiferroelectric induction layer are hafnium-free layers.

16. The semiconductor device according to claim 15, wherein a thickness of the intermediate film layer is greater than thicknesses of the first film layer, the second film layer, the first auxiliary antiferroelectric induction layer and the second auxiliary antiferroelectric induction layer.

17. A method of fabricating a semiconductor device comprising:

forming a first transistor over a substrate, wherein forming the first transistor comprises:

forming a semiconductive material layer disposed over the substrate;

forming a source region and a drain region, wherein the semiconductive material layer is disposed between the source region and the drain region;

forming a gate dielectric film stack disposed on the semiconductive material layer, wherein forming the gate dielectric film stack comprises:

forming a first film layer comprising hafnium and having a thickness of T1, wherein the first film layer is directly contacting the semiconductive material layer;

forming an intermediate film layer on the first film layer, wherein the intermediate film layer comprises hafnium and having a thickness of T3; and forming a second film layer on the intermediate film layer, wherein the second film layer comprises hafnium and having a thickness of T2, and the intermediate film layer is sandwiched in between the first film layer and the second film layer, and wherein a hafnium content of the intermediate film layer is lower than a hafnium content of the first film layer and a hafnium content of the second film layer, and wherein a ratio of the thickness T3 to the thickness T1 is in a range of 5:1 to 20:1, and a ratio of the thickness T3 to the thickness T2 is in a range of 5:1 to 20:1; and forming a gate electrode on the gate dielectric film stack, and directly contacting the second film layer.

18. The method according to claim 17, wherein the first film layer and the second film layer are formed with a material of $Hf_XZr_{(1-X)}O_2$, and wherein X is in a range of 0.5 to 0.7.

19. The method according to claim 17, wherein the intermediate film layer is formed with a material of $Hf_YZr_{(1-Y)}O_2$, and wherein Y is in a range of 0.3 to 0.5.

20. The method according to claim 17, wherein the intermediate film layer is formed with a first sub-layer in contact with the first film layer and a second sub-layer in contact with the second film layer, and wherein the method further comprises forming an antiferroelectric induction layer between the first sub-layer and the second sub-layer.

\*   \*   \*   \*   \*